United States Patent
Kuwahara (10) Patent No.: US 9,559,027 B2
(45) Date of Patent: Jan. 31, 2017

(54) SEMICONDUCTOR DEVICE AND SEMICONDUCTOR MODULE

(71) Applicant: KABUSHIKI KAISHA TOSHIBA, Tokyo (JP)

(72) Inventor: Yoshimitsu Kuwahara, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/828,256

(22) Filed: Aug. 17, 2015

(65) Prior Publication Data

US 2016/0247736 A1    Aug. 25, 2016

(30) Foreign Application Priority Data

Feb. 24, 2015 (JP) .................................. 2015-034539

(51) Int. Cl.
| | |
|---|---|
| H01L 21/54 | (2006.01) |
| H01L 23/053 | (2006.01) |
| H01L 23/18 | (2006.01) |
| H01L 23/08 | (2006.01) |
| H01L 23/367 | (2006.01) |
| H01L 25/07 | (2006.01) |

(52) U.S. Cl.
CPC ............ *H01L 23/053* (2013.01); *H01L 23/08* (2013.01); *H01L 23/18* (2013.01); *H01L 23/3675* (2013.01); *H01L 25/072* (2013.01)

(58) Field of Classification Search
CPC ........ H01L 21/54; H01L 23/06; H01L 25/072; H01L 29/7393; H01L 29/84
See application file for complete search history.

(56) References Cited

U.S. PATENT DOCUMENTS

| | | | |
|---|---|---|---|
| 4,887,149 A | * | 12/1989 | Romano' ............ H01L 23/4006 257/718 |
| 6,295,205 B1 | | 9/2001 | Lang et al. |
| 8,110,927 B2 | | 2/2012 | Schwarzbauer |
| 8,183,674 B2 | | 5/2012 | Billmann et al. |

(Continued)

FOREIGN PATENT DOCUMENTS

| | | |
|---|---|---|
| CN | 1423330 A | 6/2003 |
| CN | 1596472 A | 3/2005 |

(Continued)

OTHER PUBLICATIONS

Taiwan Office Action dated May 27, 2016, filed in Taiwan counterpart Application No. 104128921, 7 pages (with translation).

(Continued)

*Primary Examiner* — Whitney T Moore
*Assistant Examiner* — Joseph Galvin, III
(74) *Attorney, Agent, or Firm* — Patterson & Sheridan, LLP (57) ABSTRACT

A semiconductor device includes a housing with a fragile portion. The fragile unit or portion has a resistance to a pressure or a melting point temperature that is lower than other portions of the housing. The semiconductor device further includes a plurality of semiconductor elements disposed inside the housing. Each semiconductor element includes a semiconductor element region having a first surface and a second surface opposite to the first surface. A first electrode is provided on the first surface and a second electrode is provided on the second surface.

20 Claims, 4 Drawing Sheets

(56) References Cited

U.S. PATENT DOCUMENTS

| | | | | |
|---|---|---|---|---|
| 2008/0073767 A1* | 3/2008 | Taguchi | ............... | H01L 23/051 |
| | | | | 257/683 |
| 2014/0035117 A1 | 2/2014 | Hohlfeld et al. | | |
| 2014/0232841 A1* | 8/2014 | Ohta | ..................... | H04N 5/321 |
| | | | | 348/65 |
| 2015/0069589 A1* | 3/2015 | Kamata | ............... | H01L 23/051 |
| | | | | 257/666 |

FOREIGN PATENT DOCUMENTS

| | | |
|---|---|---|
| CN | 103531544 A | 1/2014 |
| JP | 2000-91455 | 3/2000 |
| KR | 2019880006990 | 11/1923 |
| KR | 1020100120006 | 11/2010 |

OTHER PUBLICATIONS

Korean Office Action dated Jul. 6, 2016, filed in Korean counterpart Application No. 10-2015-0099551, 10 pages (with translation).

* cited by examiner

SEMICONDUCTOR DEVICE AND SEMICONDUCTOR MODULE

CROSS-REFERENCE TO RELATED APPLICATION

This application is based upon and claims the benefit of priority from Japanese Patent Application No. 2015-034539, filed Feb. 24, 2015, the entire contents of which are incorporated herein by reference.

FIELD

Embodiments described herein relate generally to a semiconductor device and a semiconductor module.

BACKGROUND

A pressure contact type semiconductor device generally includes a structure in which a semiconductor element disposed in an insulating frame is interposed between and hermetically sealed in part by upper and lower electrode blocks. Internal electrical contact is maintained by applying an external pressing force from outside the upper and lower electrode blocks. Furthermore, the pressure contact type semiconductor device achieves an improvement of power density and high reliability operating at a high voltage and a high current by double-sided heat radiation.

If the semiconductor element inside the pressure contact type semiconductor device is destroyed, part of the pressure contact type semiconductor device can sometimes be short-circuited without damaging the remainder of the semiconductor device. Therefore, even after the semiconductor element is destroyed, it is possible to operate a system including the semiconductor device without stopping the system immediately by using a plurality of the pressure contact type semiconductor devices connected in series. Thus, a redundant design can easily be used with pressure contact type semiconductor devices.

However, if an overload state continues in the destroyed semiconductor element, melting of the semiconductor element can occur due to a substantial increase in temperature, and thereby an internal pressure may rise and lead to an explosion. If the explosion occurs, pieces of the semiconductor device are scattered in multiple directions, and circuits or cooling devices in the vicinity of the semiconductor device can become damaged, and thereby the whole system may become inoperable.

DETAILED DESCRIPTION

Embodiments provide a pressure contact type semiconductor device in which an improvement of reliability may be obtained.

In general, according to one embodiment, a semiconductor device includes a housing that includes a fragile portion which has a resistance to pressure that is lower than other portions of the housing. That is, the fragile unit will tend rupture, melt, or otherwise form an opening between the interior and exterior of the housing at a lower pressure differential and/or at a lower temperature than the other portions of the housing. A plurality of semiconductor elements are disposed inside the housing, each element has a first electrode on a first surface and a second electrode on a second surface opposite to the first surface. A first electrode block is provided on the first surface side and is electrically connected to the first electrode. A second electrode block is provided on the second surface side and is electrically connected to the second electrode.

Hereinafter, example embodiments will be described with reference to the drawings. Moreover, in the following description, the same reference numerals are given to the same members and for a member and the like to which description is provided once, the description will be appropriately omitted.

First Embodiment

Figure 1A:
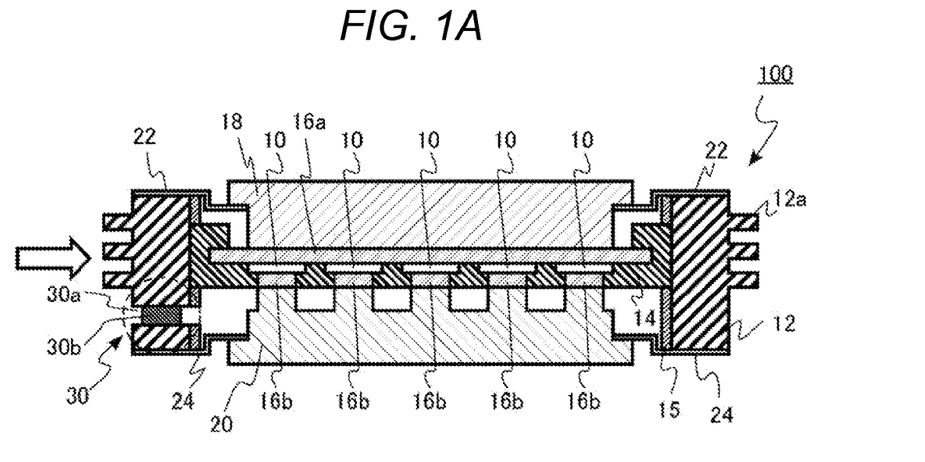
FIGS. 1A to 1C are schematic views of a semiconductor device according to a first embodiment.
Figure 1B:
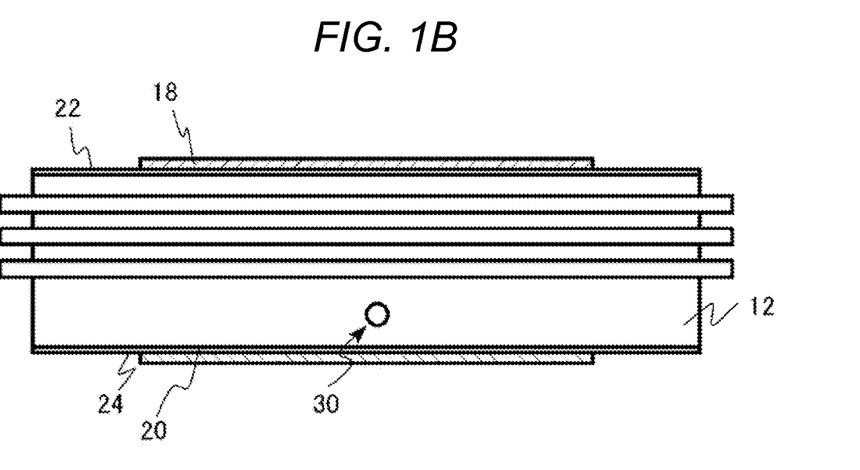
Figure 1C:
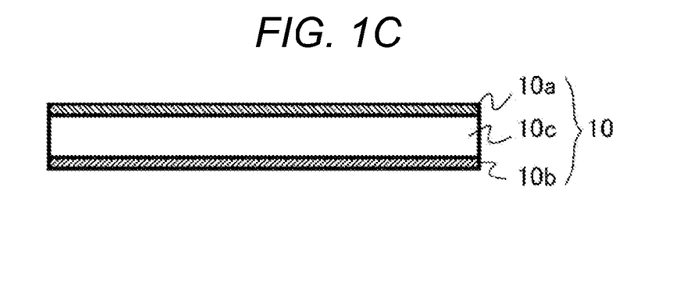

FIGS. 1A to 1C are schematic views of a semiconductor device 100 according to the first embodiment. FIG. 1A is a schematic sectional view, FIG. 1B is a schematic side view, and FIG. 1C is a schematic sectional view of a semiconductor element 10 included in the semiconductor device 100. FIG. 1B is a side view of the semiconductor device 100 when viewed from a direction of white arrow in FIG. 1A. The semiconductor device 100 according to the first embodiment is a pressure contact type semiconductor device.

The semiconductor device 100 according to the first embodiment includes a plurality of semiconductor elements 10 therein. As illustrated in FIG. 1C, the semiconductor element 10 includes a first electrode 10a on a first surface of a semiconductor element region 10c and a second electrode 10b on a second surface of the semiconductor element region 10c opposite to the first surface. The semiconductor element region 10c is provided between the first electrode 10a and the second electrode 10b.

For example, the semiconductor element 10 can be an Injection Enhanced Gate Transistor (IEGT) using silicon (Si). The IEGT is an Insulated Gate Bipolar Transistor (IGBT) with an electron injection promoting effect. The first electrode 10a can be an emitter electrode of the IEGT. The second electrode 10b can be a collector electrode of the IEGT. The semiconductor element 10 also includes a gate electrode (not specifically illustrated).

Moreover, the semiconductor element 10 is not specifically limited to being a transistor, such as an IEGT. The semiconductor element 10 can be any semiconductor element including electrodes at upper and lower portions thereof, such as a diode, for example a Fast Recovery Diode (FRD). Furthermore, the semiconductor element 10 may be a Metal Oxide Semiconductor Field Effect Transistor (MOSFET) instead of an IEGT. Furthermore, as another example, an IEGT and an FRD may be mix-loaded in the semiconductor element 10—that is, the semiconductor element 10 may include both a transistor and a diode. In addition, the semiconductor element 10 is not limited to a device formed of silicon and may be a device formed of other materials, such as silicon carbide (SiC).

Referring to FIG. 1A, the semiconductor elements 10 are arranged inside an insulating frame (hereinafter, also referred to as a housing) 12. The housing 12 can have for example, a cylindrical shape, and can be formed of a ceramic material. The housing 12 can also include one or more protrusion units 12a for maintaining insulation (e.g., creeping distance) between the first electrode 10a and the second electrode 10b.

The housing 12 may be at least partially formed of alumina. The housing 12 may also be formed by using, for example, silicon nitride, zirconia, aluminum nitride, and the like in addition to alumina.

A cushioning material 15 can be provided at an inner wall of the housing 12. The cushioning material 15 can be formed of silicone rubber.

The plurality of semiconductor elements 10 are supported by a resin frame 14. The resin frame 14 secures an insulation distance between semiconductor termination regions, such as electrodes and provides a function of aligning the plurality of semiconductor elements 10.

A thermal compensation plate 16a is provided on the first surface side of the plurality of semiconductor elements 10. A plurality of thermal compensation plates 16b is provided on a side of the second surface of the semiconductor element 10. A material having a thermal expansion coefficient close to that of the semiconductor element 10 is used to form the thermal compensation plate 16a and the thermal compensation plates 16b. For example, if the semiconductor element 10 is formed of the silicon, molybdenum having a thermal expansion coefficient close to that of the silicon can be used as the material to form the thermal compensation plates 16a, 16b.

A first electrode block 18 is provided on a side of the first surface of the semiconductor element 10. Furthermore, a second electrode block 20 is provided on a side of the second surface of the semiconductor element 10. The first electrode block 18 and the second electrode block 20 can have a shape that is, for example, circular.

The first electrode block 18 is provided in a position to contact the thermal compensation plate 16a. The second electrode block 20 is provided in a position to contact the thermal compensation plate(s) 16b. The first electrode block 18 and the second electrode block 20 are formed of a metal, such as copper.

The first electrode block 18 and the housing 12 are connected by a first flange 22. The first flange 22 is, for example, formed of a metal, such as an iron-nickel alloy.

The first electrode block 18 and the first flange 22 may be connected by welding. The first flange 22 and the housing 12 may also be connected by brazing.

The second electrode block 20 and the housing 12 are connected by a second flange 24. The second flange 24 is formed of a metal, such as iron-nickel alloy.

The second electrode block 20 and the second flange 24 can be connected by welding. The second flange 24 and the housing 12 may also be connected by brazing.

An inside of the semiconductor device 100 in which the semiconductor elements 10 are accommodated is hermetically sealed by combination of the housing 12, the first electrode block 18, the second electrode block 20, the first flange 22, and the second flange 24, wherein the housing 12 incorporates a fragile unit 30 as described below. The fragile unit 30 may also be described as a fragile portion 30. The interior space of the semiconductor device 100 is filled with an inert gas, such as nitrogen gas. The semiconductor elements 10, the thermal compensation plate 16a, the thermal compensation plate 16b, and the like are prevented from being oxidized by filling the inside of the semiconductor device with the inert gas.

The first flange 22 and the second flange 24 are formed of a plate-shaped metal and have spring characteristics of moderate strength. Thus, if a pressing force is applied to the first electrode block 18 and the second electrode block from outside of the semiconductor device 100, the semiconductor elements 10, the thermal compensation plate 16a, the thermal compensation plate(s) 16b, the first electrode block 18, and the second electrode block 20 come into close contact with each other, and thereby good electrical contact is maintained therebetween. Thus, the first electrode block 18 is electrically connected to the first electrode 10a, and the second electrode block 20 is electrically connected to the second electrode 10b.

The semiconductor device 100 further includes a fragile unit 30 incorporated in the housing 12. The fragile unit 30 forms a portion of the seal between the interior (in which the semiconductor elements 10 are disposed) and the exterior of the semiconductor device 100. The fragile unit 30 has a resistance with respect to a pressure and/or temperature is lower than other portions of the seal. As illustrated in FIG. 1A, the fragile unit 30 includes a hole 30a provided in the housing 12 and a stopper 30b positioned to seal the hole 30a. Airtightness of the inside (interior space) of the housing 12 is maintained by the presence of stopper 30b.

A material of the stopper 30b can be a resin material. For example, the material of the stopper 30b can be Teflon®.

Moreover, in some embodiments, a plurality of fragile units 30 may be provided in the housing 12.

Next, an operation and effect of the semiconductor device 100 according to the first embodiment will be described.

If the semiconductor element 10 is included in a semiconductor device similar to the semiconductor device 100 except that a fragile unit 30 is not included, then an overload of the semiconductor element can result in an explosion of the semiconductor device. For example, the semiconductor element 10 in such a device may be destroyed and short-circuited by applying an overcurrent, and if the overload state continues, then melting of the semiconductor element 10 occurs due to a substantial increase in temperature, and the semiconductor device may consequently explode. If an explosion of the semiconductor device occurs, then the housing 12 and the like can be damaged, and thereby pieces of the semiconductor device can be scattered. Nearby circuits, cooling devices and the like in the vicinity of the semiconductor device may also be damaged by the scattered pieces, and thereby a system incorporating this type of semiconductor device may be rendered inoperable upon failure of a single semiconductor element 10, which ultimately causes an explosion.

Conversely, in the semiconductor device 100 of the first embodiment, the housing 12 is intentionally provided with (designed to incorporate) the fragile unit 30. Thus, for example, if the pressure or temperature within the semiconductor device 100 is sufficiently increased, the seal between the interior and exterior of the semiconductor device is destroyed at the position of the fragile unit 30 before the semiconductor device 100 explodes in an uncontrolled manner, and the nearby circuits, cooling devices, and the like need not be damaged.

The following example illustrates the benefits provided by the fragile unit 30 of the semiconductor device 100. For example, if the pressure inside the semiconductor device 100 is sufficiently increased, then the seal maintained by the stopper 30b breaks or otherwise ruptures, and thereby the pressure in the semiconductor device 100 is released and the uncontrolled explosion of the semiconductor device 100 is prevented. Furthermore, for example, if the temperature in the semiconductor device 100 is sufficiently increased, then the stopper 30b can be melted (e.g., the stopper 30b has a lower melting point than other components of the seal) or softened, and thereby the seal maintained by the stopper 30b is broken and the pressure in the semiconductor device is released, and the uncontrolled explosion of the semiconductor device 100 is prevented. Thus, it is possible to prevent an explosion and the subsequent scattering of pieces of the semiconductor device that can damage the circuits, cooling devices, and the like in the vicinity of the semiconductor device.

Furthermore, by including the fragile unit 30, it is also possible to predict what portions of the semiconductor device 100 and nearby portions of the system will be affected by the destruction/failure of the semiconductor element 10. Thus, even if pieces of the semiconductor device 100 are to be scattered, it is possible to prevent or limit secondary damage of the system by adopting a system design in which the circuits, other parts, and the like that are likely to be damaged by a scattered part are not arranged in the vicinity of the fragile unit 30.

In addition, even if destruction of the semiconductor element 10 occurs, any damage to the housing 12 can be reduced by the cushioning material 15.

As described above, according to the first embodiment, occurrence of an explosion is suppressed and the pressure contact type semiconductor device 100 with a high reliability is achieved. Furthermore, even if the explosion occurs, potential secondary damage of the system can also be prevented or limited.

Moreover, the fragile unit 30 can have a resistance of about two times to about ten times as strong as the normal operating pressure inside the housing 12 at a normal operating temperature of the semiconductor device 100. In this context, the normal operating pressure inside housing 12 corresponds to a typical and/or suggested pressure inside housing 12 during normal and/or suggested operation(s) of the pressure contact type semiconductor device 100. The normal operating pressure inside housing 12 may be a calculated design value for the pressure contact semiconductor device 100. Normal operating temperature corresponds to a temperature during typical and/or suggested operation(s) for the pressure contact semiconductor device 100. If the resistance of the fragile unit 30 is below the range described above, the seal maintained by the fragile unit 30 may be destroyed in a state where the semiconductor element 10 has not been destroyed. If the resistance is above the range described above, then the semiconductor device 100 may explode before the fragile unit 30 is ruptured (or otherwise breaks or fails) by design.

Furthermore, a shape of the hole 30a which is the fragile unit 30 is not limited to a circle and may be another shape, such as a triangle, a square, another polygon, or an irregular shape.

Second Embodiment

Figure 2A:
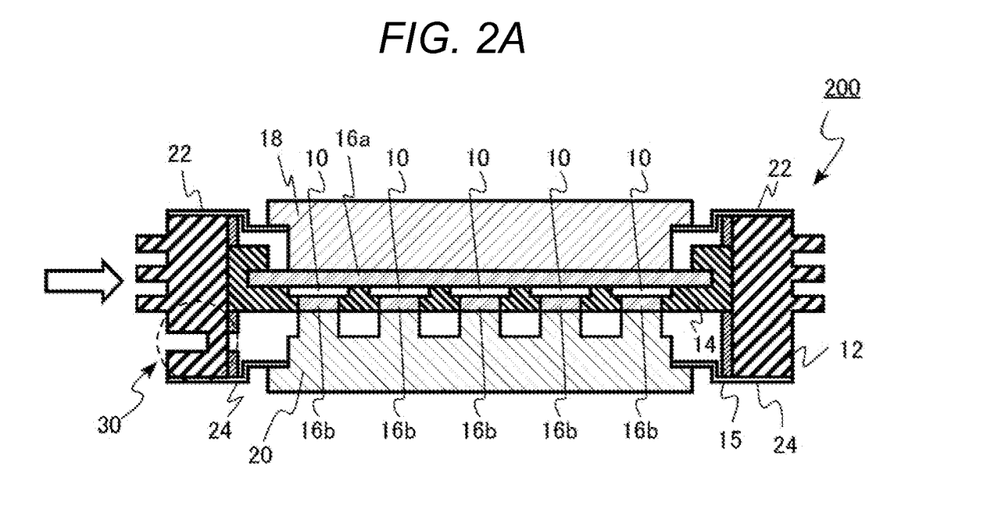
FIGS. 2A and 2B are schematic views of a semiconductor device according to a second embodiment.
Figure 2B:
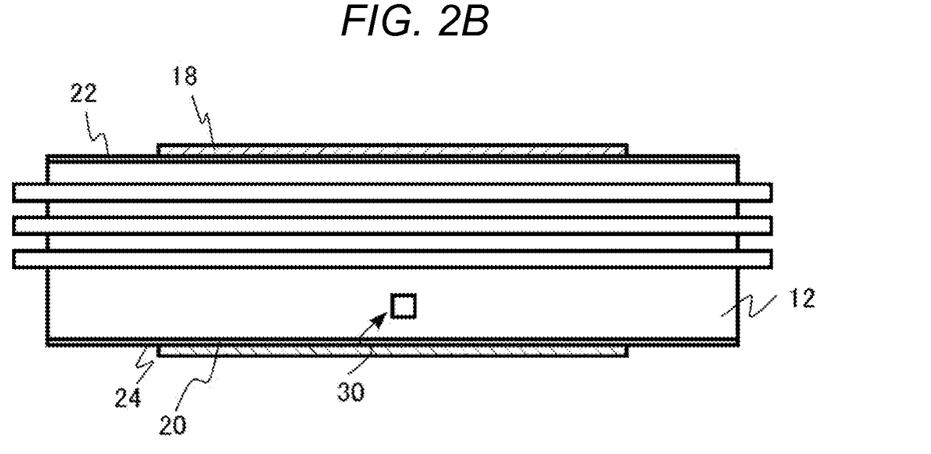

A semiconductor device 200 according to the second embodiment is similar to the semiconductor device 100 other than that a fragile unit 30 included in the housing 12 is a portion of the housing 12 having a film (wall) thickness that is less than other portions of the housing 12.

FIGS. 2A and 2B are schematic views of the semiconductor device according to the second embodiment. FIG. 2A is a schematic sectional view and FIG. 2B is a schematic side view. FIG. 2B is a side view when viewed from a direction of a white arrow in FIG. 2A. The semiconductor device 200 according to the second embodiment is a pressure contact type semiconductor device.

The semiconductor device 200 includes a fragile unit 30. The fragile unit 30 comprises a same material as the housing 12, but a film thickness of the fragile unit 30 is locally thinner than the film thickness of the housing 12. That is, a wall thickness between the interior and exterior of the semiconductor device 200 is less in the fragile unit 30 than in the other portions of the housing 12. Thus, the fragile unit 30 having the reduced wall thickness is more easily destroyed than other portions other than of the housing 12. Moreover, the fragile unit 30 can have a designed propensity to rupture at about two times to about ten times as the normal operating pressure inside the housing 12 at a normal operating temperature.

According to the second embodiment, similar to the first embodiment, occurrence of the device explosion is suppressed and the pressure contact type semiconductor device 200 with a high reliability is achieved. Furthermore, even if an explosion occurs in the semiconductor device 200, secondary damage of the system can be prevented because it is known that the fragile unit 30 will generally be the location where the destruction of the seal occurs and other components in the system can be placed at locations other than near the fragile unit 30.

Third Embodiment

Figure 3:
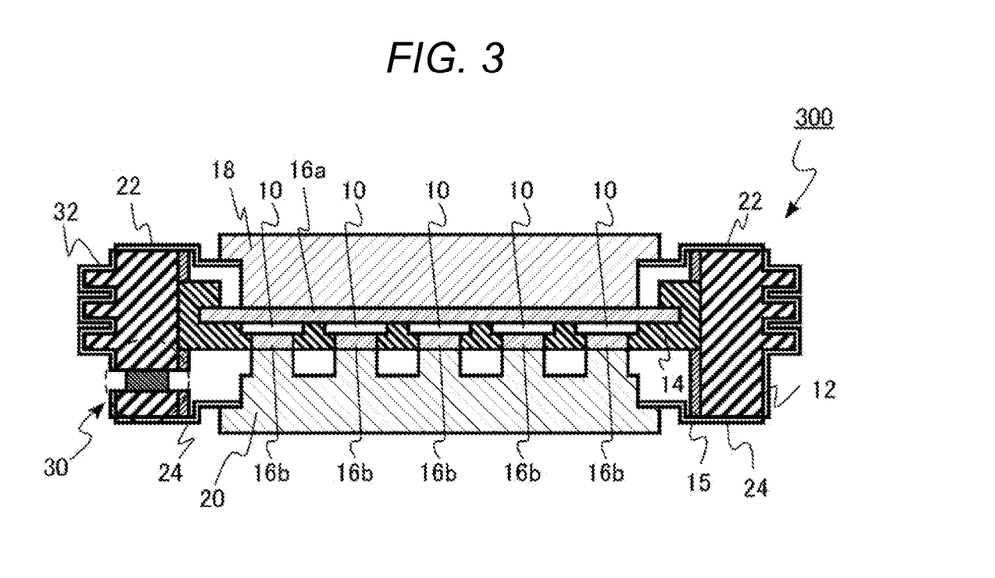
FIG. 3 is a schematic sectional view of a semiconductor device according to a third embodiment.

A semiconductor device 300 according to the third embodiment is similar to that according to the first embodiment other than that a resin coating layer 32 is provided on an outer surface of the housing 12.

FIG. 3 is a schematic sectional view of the semiconductor device 300 according to the third embodiment. The semiconductor device 300 according to the third embodiment is a pressure contact type semiconductor device.

The resin coating layer 32 is provided on the outer surface of the housing 12. For example, the resin coating layer 32 is formed of a Fiber Reinforced Plastic (FRP).

According to the third embodiment, similar to the first embodiment, occurrence of the explosion is suppressed by use of the fragile unit 30, and the pressure contact type semiconductor device 300 with a high reliability is achieved. Furthermore, even if the explosion occurs, any secondary damage of the system can be prevented or reduced because it is known that the fragile unit 30 will be the location where the destruction of the seal occurs and other components in the system can be placed at locations other than near the fragile unit 30. Furthermore, even if the housing 12 is destroyed in an uncontrolled manner, it is possible to prevent or limit pieces of the semiconductor device 300 from being scattered by adding the resin coating layer 32, which provides extra strength to the overall structure of the housing 12.

Fourth Embodiment

Figure 4:
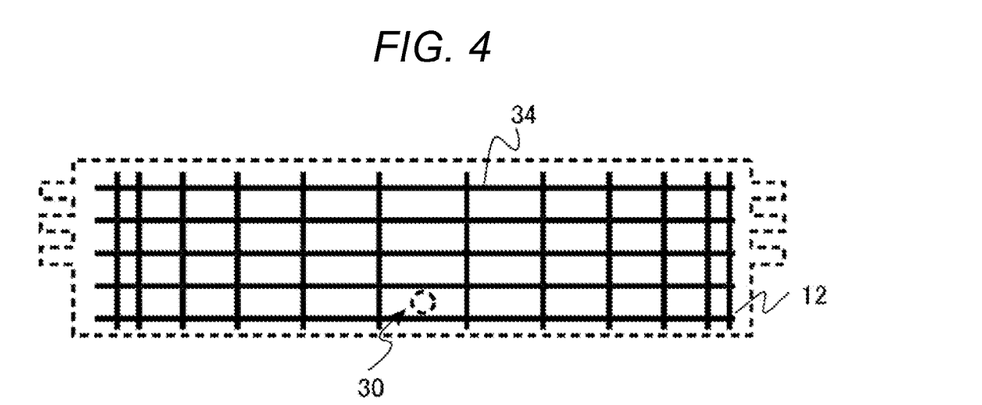
FIG. 4 is a schematic view of a housing to be used in a semiconductor device according to a fourth embodiment.

A semiconductor device 400 according to the fourth embodiment is similar to that according to the first embodiment other than that a metal net 34 (mesh) is included within the material of the housing 12, such as being embedded in the housing 12.

FIG. 4 is a schematic view of a housing 12 of the semiconductor device 400 according to the fourth embodiment.

The semiconductor device according to the fourth embodiment includes a metal net 34 within the material of the housing 12. For example, if the housing 12 is manufactured by sintering, the metal net 34 is included inside the material forming the housing 12. The fragile unit 30 is positioned within an opening in the metal net 34. Thus, the metal net 34 does not prevent the seal maintained by the fragile unit 30 from being destroyed.

According to the fourth embodiment, similar to the first embodiment, occurrence of the explosion is suppressed by use of the fragile unit 30, and the pressure contact type semiconductor device 400 with a high reliability is achieved. Furthermore, even if the explosion occurs, secondary damage of the system can be prevented or reduced because it is known that the fragile unit 30 will be the location where the destruction of the seal occurs, and other components in the system can be placed at locations other than near the fragile unit 30. Furthermore, the strength of portions of the housing are increased by the metal net 34 and thus reliability of the semiconductor device 400 is further increased by including the metal net 34.

Fifth Embodiment

Figure 5:
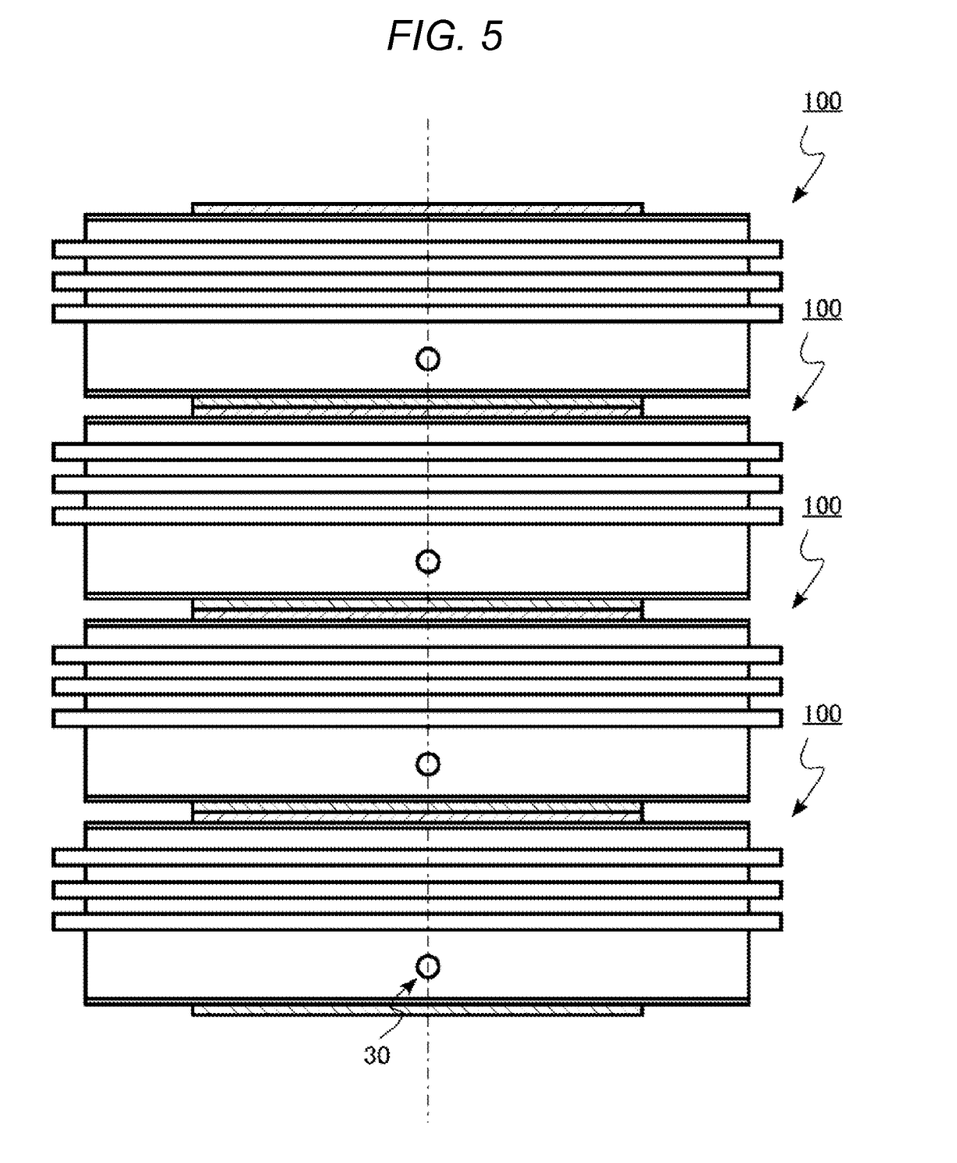
FIG. 5 is a schematic side view of a semiconductor module according to a fifth embodiment.

A semiconductor module according to the fifth embodiment includes a plurality of semiconductor devices 100. Each of the semiconductor devices 100 of the semiconductor module include the fragile unit 30 as described above in reference to the first embodiment. The plurality of semiconductor devices 100 of the semiconductor module are connected in series such that positions of the fragile units are respectively aligned along a common line.

FIG. 5 is a schematic side view of the semiconductor module according to the fifth embodiment. In the semiconductor module according to the fifth embodiment, four semiconductor devices 100 are connected in series.

As illustrated in FIG. 5, four semiconductor devices 100 are connected such that positions of the fragile units 30 are respectively aligned along one line. For example, the four semiconductor devices 100 are fixed to each other such that the electrodes thereof can pressed together by a support frame (not specifically illustrated).

In the semiconductor module according to the fifth embodiment, it is possible to limit how a destruction of one or more of the semiconductor devices 100 could affect the surrounding components by arranging the positions of the fragile units 30 along a common line.

Thus, it is possible to prevent any secondary damage of the system because it is known that the fragile units 30 aligned along the common line will generally be the location where the destruction of the seal occurs and other components in the system can be placed at locations other than near the fragile units 30 or in the expected fragmentation pathway.

Moreover, the number of the connected semiconductor devices 100 in the semiconductor module is not limited to four and, for example, may be two, three, or five or more. Although the semiconductor module of the fifth embodiment is described as including a plurality of semiconductor devices 100, a semiconductor module may also include a plurality of the semiconductor devices 200, 300, and 400 from the other embodiments. Furthermore, a semiconductor module may include a semiconductor device from more than one of the embodiments described above. For example, a semiconductor module may include a semiconductor device 100 and a semiconductor device 200. Also, an individual semiconductor device may include the features of the different embodiments described above. For example, a semiconductor device could include the fragile unit 30 from the second embodiment, the resin coating layer 32 from the third embodiment, and the metal net 34 from the fourth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a housing including a fragile portion having a resistance to pressure that is lower than any other portion of the housing;
    a plurality of semiconductor elements arranged inside the housing, each semiconductor element comprising:
        a semiconductor element region having a first surface and a second surface opposite to the first surface;
        a first electrode on the first surface; and
        a second electrode on the second surface;
    a first electrode block on a first surface side of the housing and electrically connected to each first electrode; and
    a second electrode block on a second surface side of the housing and electrically connected to each second electrode.

2. The semiconductor device according to claim 1, wherein the fragile portion comprises a hole in the housing and a stopper that blocks the hole.

3. The semiconductor device according to claim 2, wherein the stopper is made of a resin.

4. The semiconductor device according to claim 2, wherein the hole is circular.

5. The semiconductor device according to claim 1, wherein the fragile portion comprises a portion of the housing that has a wall thickness which is less than other portions of the housing such that the fragile portion has a first resistance to pressure that is about two times to about ten times of a normal pressure, and the other portions of the housing have a second resistance to pressure that is greater than the first resistance.

6. The semiconductor device according to claim 1, further comprising a resin coating layer provided on an outer surface of the housing.

7. The semiconductor device according to claim 6, wherein the resin coating layer is a fiber reinforced plastic.

8. The semiconductor device according to claim 1, further comprising a metal mesh disposed internally within a material of the housing.

9. The semiconductor device according to claim 8, wherein the fragile portion is disposed within an opening in the metal mesh.

10. The semiconductor device according to claim 1, further comprising a silicone rubber material on an inner wall of the housing.

11. The semiconductor device according to claim 1, wherein the fragile portion comprises a plurality of holes in the housing.

12. The semiconductor device according to claim 1, further comprising:

a first flange connecting the first electrode block and the housing;

a second flange connecting the second electrode block and the housing;

a resin frame supporting the plurality of semiconductor elements within the housing; and a first thermal compensation plate between the first electrode block and the plurality of semiconductor elements.

13. A semiconductor device, comprising:

a housing including a fragile portion in an external wall, an open connection between an interior and an exterior of the housing being provided when a temperature exceeds a predetermined value;

a semiconductor element disposed with the interior of the housing and having a first electrode on a first surface side and a second electrode on a second surface side opposite the first surface side;

a first electrode block on the first surface side and connected to the housing; and a second electrode block on the second surface side and connected to the housing.

14. The semiconductor device according to claim 13, wherein the fragile portion comprises a first material having a melting point that is lower than a melting point of a second material comprising the housing.

15. The semiconductor device according to claim 13, wherein the fragile portion comprises a hole through the external wall of the housing and a stopper which seals the hole.

16. The semiconductor device according to claim 13, wherein the fragile portion is a first portion of the housing having an external wall thickness that is less than an external wall thickness of other portions of the housing.

17. The semiconductor device according to claim 16, that the fragile portion has a first resistance to pressure that is about two times to about ten times of a normal pressure inside the housing, and the other portions of the housing have a second resistance to pressure that is greater than the first resistance.

18. The semiconductor device according to claim 13, further comprising a metal mesh disposed within a material of the housing.

19. A semiconductor module, comprising:

a plurality of semiconductor devices, each semiconductor device comprising:

a housing including a fragile portion in an external wall, the fragile portion being configured to provide an open connection between an interior and an exterior of the housing when a pressure difference between inside and outside the housing exceeds a predetermined value or a temperature exceeds a threshold temperature;

a semiconductor element disposed with the interior of the housing and having a first electrode on a first surface side and a second electrode on a second surface side opposite the first surface side;

a first electrode block on the first surface side and connected to the housing; and a second electrode block on the second surface side and connected to the housing;

wherein the plurality of semiconductor devices are connected in series and fragile portions of the plurality of semiconductor devices are aligned along a common line.

20. The semiconductor module according to claim 19, wherein at least one fragile portion comprises a hole through the external wall of one of the housings and a stopper which seals the hole.

* * * * *